(12) United States Patent
Lee et al.

(10) Patent No.: US 8,665,413 B2
(45) Date of Patent: Mar. 4, 2014

(54) THIN FILM TRANSISTOR ARRAY PANEL, LIQUID CRYSTAL DISPLAY, AND MANUFACTURING METHOD THEREOF

(75) Inventors: Myung Sub Lee, Seoul (KR); Ji Young Jeong, Cheonan-si (KR); Sun-Kyu Joo, Suwon-si (KR); Myung Jin Lee, Asan-si (KR)

(73) Assignee: Samsung Display Co., Ltd (KR)

( * ) Notice: Subject to any disclaimer, the term of this patent is extended or adjusted under 35 U.S.C. 154(b) by 434 days.

(21) Appl. No.: 13/025,983

(22) Filed: Feb. 11, 2011

(65) Prior Publication Data
US 2012/0099042 A1    Apr. 26, 2012

(30) Foreign Application Priority Data
Oct. 22, 2010    (KR) .......................... 10-2010-0103465

(51) Int. Cl.
*G02F 1/1339*    (2006.01)
(52) U.S. Cl.
CPC ........ *G02F 1/13394* (2013.01); *G02F 1/13392* (2013.01)
USPC .......................... 349/155; 349/156; 349/157

(58) Field of Classification Search
CPC ............ G02F 1/13394; G02F 1/13392; G02F 2001/13396
USPC ................................................... 349/155–157
See application file for complete search history.

(56) References Cited

U.S. PATENT DOCUMENTS

2006/0285060 A1 * 12/2006 Misaki et al. .................. 349/156
2009/0310050 A1 * 12/2009 Shin et al. ....................... 349/39

* cited by examiner

*Primary Examiner* — Thanh-Nhan P Nguyen
(74) *Attorney, Agent, or Firm* — Innovation Counsel LLP

(57) ABSTRACT

Provided are a thin film transistor display panel, a liquid crystal display, and a manufacturing method therefor, that can prevent errors or omissions in rubbing due to a step between a pixel electrode and a data line, and the resulting light leakage, as well as increase the effective area ratio of a spacer and prevent shorts from occurring during at least some repair processes. The thin film transistor array panel includes: a first substrate; a gate line and a data line formed on the first substrate; a step preventing member formed on the data line to at least partially fill a volume positioned between the data line and a pixel electrode; and a spacer formed on the first substrate, wherein the spacer and the step preventing member comprise the same material.

33 Claims, 14 Drawing Sheets

THIN FILM TRANSISTOR ARRAY PANEL, LIQUID CRYSTAL DISPLAY, AND MANUFACTURING METHOD THEREOF

CROSS-REFERENCE TO RELATED APPLICATION

This application claims priority to, and the benefit of, Korean Patent Application No. 10-2010-0103465 filed in the Korean Intellectual Property Office on Oct. 22, 2010, the entire contents of which are incorporated herein by reference.

BACKGROUND OF THE INVENTION (a) Field of the Invention

Embodiments of the present invention relate generally to flat panel displays. More specifically, embodiments of the present invention relate to flat panel displays having improved rubbing and short circuit prevention characteristics.

(b) Description of the Related Art

A liquid crystal display, as one type of flat panel display that is finding wide acceptance at present, typically includes two display panels on which electric field generating electrodes (such as a pixel electrode) and a common electrode are formed, with a liquid crystal layer interposed therebetween. The display crystal display generates an electric field in the liquid crystal layer by applying a voltage to the electric field generating electrode, and through the resulting electric field, determines an orientation of liquid crystal molecules of the liquid crystal layer. This in turn controls polarization of incident light to thereby display an image.

The liquid crystal display also includes a switching element connected to each pixel electrode, and a plurality of signal lines, including gate lines and data lines, for applying voltage to the pixel electrode via the switching element.

The liquid crystal display is used for various purposes. In particular, when these displays are used as monitors, they typically include an insulating layer that is generally made of an inorganic material. As a result, unlike thicker organic insulating layers, use of such thinner inorganic insulating layers results in a step that is produced between the data line and the pixel electrode. This step can create errors during rubbing processes.

Furthermore, in structures in which a storage electrode is formed below the data line, the step between the data line and the pixel electrode grows even larger, worsening the errors during rubbing processes. These errors can result in poor alignment of the liquid crystal, in turn resulting in light leakage between the data line and pixel electrode.

Further, conventional liquid crystal displays include a thin film transistor array panel and an opposed substrate, a spacer is formed on the opposed substrate, such that the top of the spacer faces the thin film transistor array panel. On the thin film transistor array panel, gate lines, data lines, and thin film transistors, etc., are formed. On the opposed substrate, however, there is no component or common electrode, and color filters, etc could be formed. Thus, the thin film transistor array panel is not typically as flat as the opposed substrate, resulting in a relatively small area upon which the spacer can contact the substrate.

Further, when a repair process is performed on a thin film transistor or a data line, the thin film transistor array panel may be short-circuited from the common electrode of the upper substrate, i.e., the common electrode panel.

The above information disclosed in this Background section is only for enhancement of understanding of the background of the invention, and therefore it may contain information that does not lie in the prior art.

SUMMARY OF THE INVENTION

Embodiments of the present invention provide a thin film transistor array panel, a liquid crystal display, and a manufacturing method therefor that allows for more complete rubbing, by eliminating or reducing a step difference in height between a pixel electrode and a data line, as well as the resulting light leakage.

Further, embodiments of the present invention provide a thin film transistor array panel, a liquid crystal display, and a manufacturing method therefor that can increase the effective area ratio of a spacer, i.e. the area of contact between a spacer and its opposing substrate.

In addition, embodiments of the present invention provide a thin film transistor array panel, a liquid crystal display, and a manufacturing method therefor that can prevent a short-circuit failure from occurring while a repair process is performed.

An exemplary embodiment of the present invention provides a thin film transistor array panel including: a first substrate; a gate line and a data line formed on the first substrate; a step preventing member formed on the data line; and a spacer formed on the first substrate to at least partially fill a volume positioned between the data line and a pixel electrode, wherein the spacer and the step preventing member comprise the same material.

The thin film transistor array panel may further include a thin film transistor connected to the gate line and the data line, wherein the spacer may be formed on the thin film transistor.

A center of the step preventing member may at least partially overlap the data line and a periphery of the step preventing member may not overlap the data line.

A thickness of the periphery of the step preventing member may be larger than a thickness of the center of the step preventing member.

A thickness of the step preventing member may increase from the center to the periphery.

The center of the step preventing member may be formed according to a half-tone mask.

The periphery of the step preventing member may be formed according to a slit mask.

The slit mask may include slits, and gaps between the slits can be narrower proximate to an edge of the slit mask than proximate to a center of the slit mask.

The thin film transistor array panel may further include an alignment layer formed on the first substrate and rubbed by a roller.

The spacer and the step preventing member each comprise a transparent material.

The thin film transistor array panel may further include a storage electrode at least partially overlapping the data line on the first substrate and having a width larger than a width of the data line.

Another exemplary embodiment of the present invention provides a thin film transistor array panel including: a first substrate; a gate line and a data line formed on a first substrate; a storage electrode at least partially overlapping the data line on the first substrate and having a width larger than a width of the data line; a thin film transistor connected to the gate line and the data line; a pixel electrode formed in a pixel area generally defined by the gate line and the data line; a step preventing member formed on the data line to at least partially fill a volume positioned between the data line and the pixel electrode; and a spacer formed on the thin film transistor, wherein the spacer and the step preventing member each comprise the same material.

The thin film transistor may include: a gate electrode protruding from the gate line; a source electrode protruding onto the gate electrode from the data line; a drain electrode spaced apart from the source electrode; and a semiconductor layer formed between the gate electrode and the source and drain electrodes.

The semiconductor layer may extend to the data line.

The thin film transistor array panel may further include: a gate insulating layer formed on the gate line and the gate electrode; and a passivation layer formed on the data line, the source electrode, and the drain electrode, wherein the gate insulating layer and the passivation layer may each comprise an inorganic insulating material including silicon oxide and silicon nitride.

A center of the step preventing member may overlap the data line and a periphery of the step preventing member may not overlap the data line. Also, a thickness of the step preventing member may increase from the center to the periphery.

The center of the step preventing member may be formed according to a half-tone mask and the periphery of the step preventing member may be formed according to a slit mask including slits, where gaps between the slits are narrower proximate to an edge of the mask than proximate to a center of the mask.

The thin film transistor array panel may further include an alignment layer formed on the passivation layer and the pixel electrode, wherein the alignment layer is rubbed by a roller.

The thin film transistor array panel may further include a storage electrode line formed generally parallel to the gate line, wherein the storage electrode line is connected to the storage electrode.

Yet another exemplary embodiment of the present invention provides a liquid crystal display including: a first substrate and a second substrate facing each other; a gate line and a data line formed on a first substrate; a thin film transistor connected to the gate line and the data line; a pixel electrode formed in a pixel area defined generally by the gate line and the data line; a step preventing member formed on the data line to at least partially fill a volume positioned between the data line and a pixel electrode; a spacer formed on the thin film transistor; and a light blocking member which has a width larger than the data line to correspond to the data line, wherein the spacer and the step preventing member each comprise the same material.

The liquid crystal display may further include a common electrode formed on a front surface of the second substrate.

The liquid crystal display may further include a color filter formed on the second substrate and positioned to correspond to the pixel area.

The liquid crystal display may further include a storage electrode at least partially overlapping the data line on the first substrate and having a width larger than a width of the data line.

The thin film transistor may include: a gate electrode protruding from the gate line; a source electrode protruding onto the gate electrode from the data line; a drain electrode spaced apart from the source electrode; and a semiconductor layer formed below the data line, the source electrode, and the drain electrode.

The liquid crystal display may further include: a gate insulating layer formed on the gate line and the gate electrode; and a passivation layer formed on the data line, the source electrode, and the drain electrode, wherein the gate insulating layer and the passivation layer each comprise an inorganic insulating layer including silicon oxide and silicon nitride.

A center of the step preventing member may at least partially overlap the data line and a periphery of the step preventing member does not overlap the data line. Also, a thickness of the step preventing member may increase from the center to the periphery.

The center of the step preventing member may be formed according to a half-tone mask and a periphery of the step preventing member may be formed according to a slit mask including slits, where gaps between the slits are narrower proximate to an edge of the mask than proximate to a center of the mask.

The liquid crystal display may further include an alignment layer formed on the passivation layer and the pixel electrode, wherein the alignment layer is rubbed by a roller.

Still another exemplary embodiment of the present invention provides a method of fabricating a thin film transistor array panel, the method including: (a) forming a gate line and a gate electrode (b) forming a gate insulating layer on the gate line and the gate electrode; (c) forming a semiconductor layer on the gate insulating layer to correspond to the gate electrode; (d) forming a data line, a source electrode, and a drain electrode on the gate insulating layer and the semiconductor layer; (e) forming a passivation layer on the data line, the source electrode, and the drain electrode; (f) forming a contact hole on the passivation layer to expose at least a portion of the drain electrode; (g) forming a pixel electrode connected to the drain electrode through the contact hole in a pixel area generally defined by the gate line and the data line; and (h) forming a spacer corresponding to a thin film transistor that includes the gate electrode, the source electrode, and the drain electrode, and forming a step preventing member on the passivation layer so as to at least partially fill a volume positioned between the data line and the pixel electrode.

The spacer and the step preventing member may each comprise the same material.

The spacer and the step preventing member may each comprise a transparent material.

A center of the step preventing member may at least partially overlap the data line and a periphery of the step preventing member may not overlap the data line.

A thickness of the step preventing member may increase from the center to the periphery.

The center of the step preventing member may be formed according to a half-tone mask, the periphery of the step preventing member may be formed according to a slit mask including slits, wherein gaps between the slits are narrower proximate to an edge of the mask than proximate to a center of the mask, and the half-tone mask and the slit mask may be included in one mask.

The method may further include: (i) forming an alignment layer on the first substrate and over the spacer and the step preventing member; and (j) rubbing the alignment layer with a roller.

In the method, (a) may further comprise forming a storage electrode line extending generally parallel to the gate line, and a storage electrode connected to the storage electrode line, where the storage electrode may at least partially overlap the data line and may have a width larger than a width of the data line.

The semiconductor layer, the data line, the source electrode, and the drain electrode may be formed according to one mask, and the semiconductor layer may extend to the data line.

The gate insulating layer and the passivation layer may each comprise an inorganic insulating material including silicon oxide and silicon nitride.

Still another exemplary embodiment of the present invention provides a method of manufacturing a liquid crystal display, the method including: (a) forming a gate line and a gate electrode on a first substrate; (b) forming a gate insulating layer on the gate line and the gate electrode; (c) forming a semiconductor layer on the gate insulating layer to correspond to the gate electrode; (d) forming a data line, a source electrode, and a drain electrode on the gate insulating layer and the semiconductor layer; (e) forming a passivation layer on the data line, the source electrode, and the drain electrode; (f) forming a contact hole on the passivation layer to expose a portion of the drain electrode; (g) forming a pixel electrode connected to the drain electrode through the contact hole in a pixel area generally defined by the gate line and the data line; (h) forming a spacer corresponding to a thin film transistor that includes the gate electrode, the source electrode, and the drain electrode, and forming a step preventing member on the passivation layer so as to at least partially fill a volume positioned between the data line and the pixel electrode, wherein the spacer and the step preventing member each comprise the same material, and wherein the spacer and the step preventing member are formed on the passivation layer; (i) forming an alignment layer over the spacer and the step preventing member; (j) rubbing the alignment layer with a roller; and (k) forming a light blocking member on a second substrate to correspond to the data line, the light blocking member having a width larger than a width of the data line.

The method may further include (l) forming a color filter on the second substrate to correspond to the pixel area; and (m) forming a common electrode on a front surface of the second substrate.

In the method, (a) may further comprise forming a storage electrode line extending generally parallel to the gate line, and a storage electrode connected to the storage electrode line, where the storage electrode may at least partially overlap the data line and may have a width larger than a width of the data line.

A center of the step preventing member may at least partially overlap the data line and a periphery of the step preventing member may not overlap the data line. Also, a thickness of the step preventing member may increase from the center to the periphery.

The center of the step preventing member may be formed according to a half-tone mask, the periphery of the step preventing member may be formed according to a slit mask including slits, wherein gaps between the slits are narrower proximate to an edge of the mask than proximate to a center of the mask. The half-tone mask and the slit mask may be included in one mask.

The semiconductor layer, the data line, the source electrode, and the drain electrode may be formed according to one mask, and the semiconductor layer may extend to the data line.

The gate insulating layer and the passivation layer may each comprise an inorganic insulating material including silicon oxide and silicon nitride.

According to the exemplary embodiments of the present invention, a thin film transistor array panel, a liquid crystal display, and a manufacturing method therefor can prevent or reduce incomplete rubbing, or errors during rubbing, due to a step between a pixel electrode and a data line, and the resulting light leakage, by forming a step preventing member on the data line.

Further, it is possible to increase the effective area ratio, or the proportion of a spacer's area that contacts its opposing substrate, by forming the spacer on the thin film transistor array panel, thereby improving space uniformity between the two substrates of the liquid crystal display.

In addition, it is possible to prevent the thin film transistor array panel from being shorted-circuited via the common electrode during data line repair, as the spacers of the invention maintain more uniform spacing between the two substrates.

DETAILED DESCRIPTION OF THE EMBODIMENTS

Figure 1:
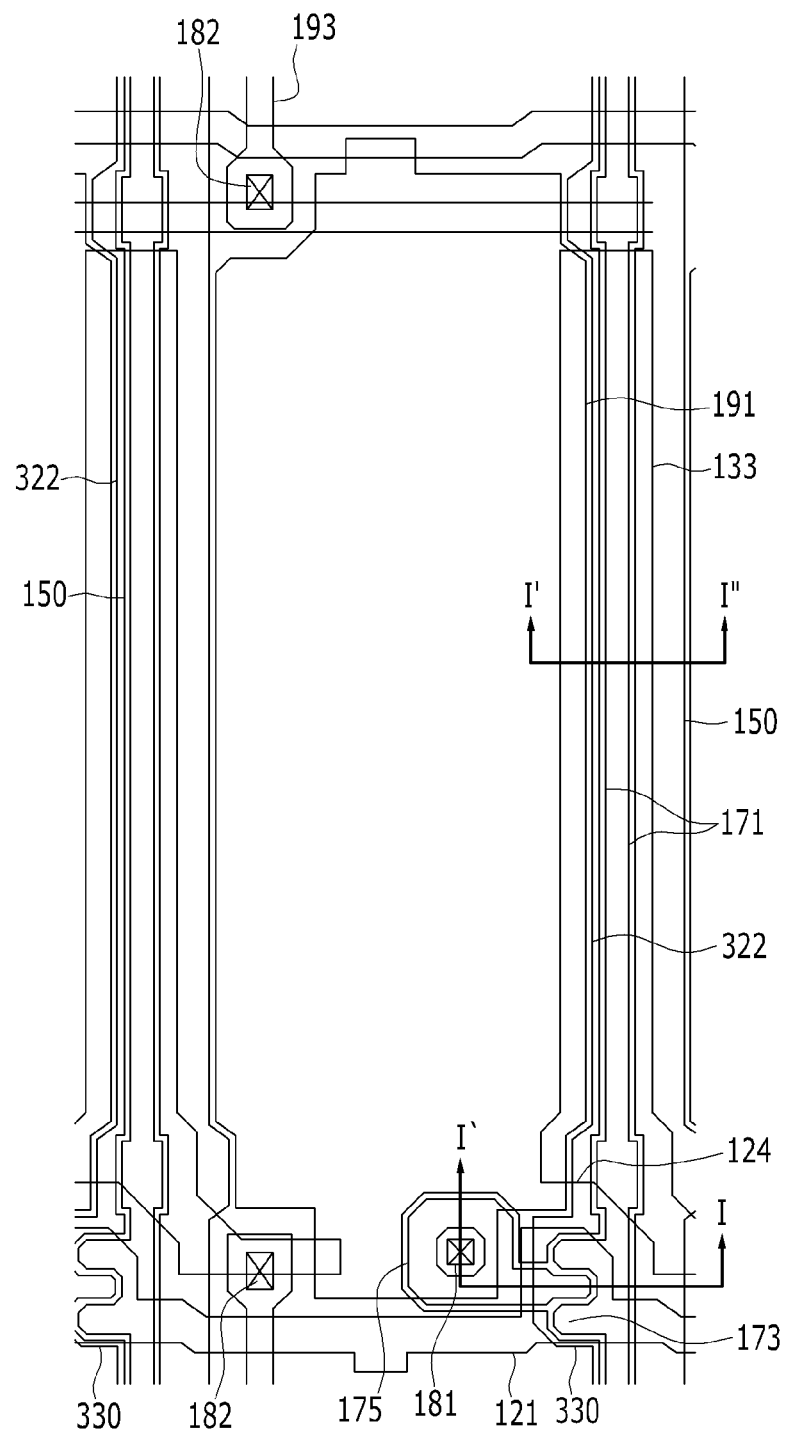
FIG. 1 is a layout view of a thin film transistor array panel of a liquid crystal display according to an exemplary embodiment of the present invention.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

First, a liquid crystal display according to an exemplary embodiment of the present invention will be described below with reference to the accompanying drawings.

Figure 2:
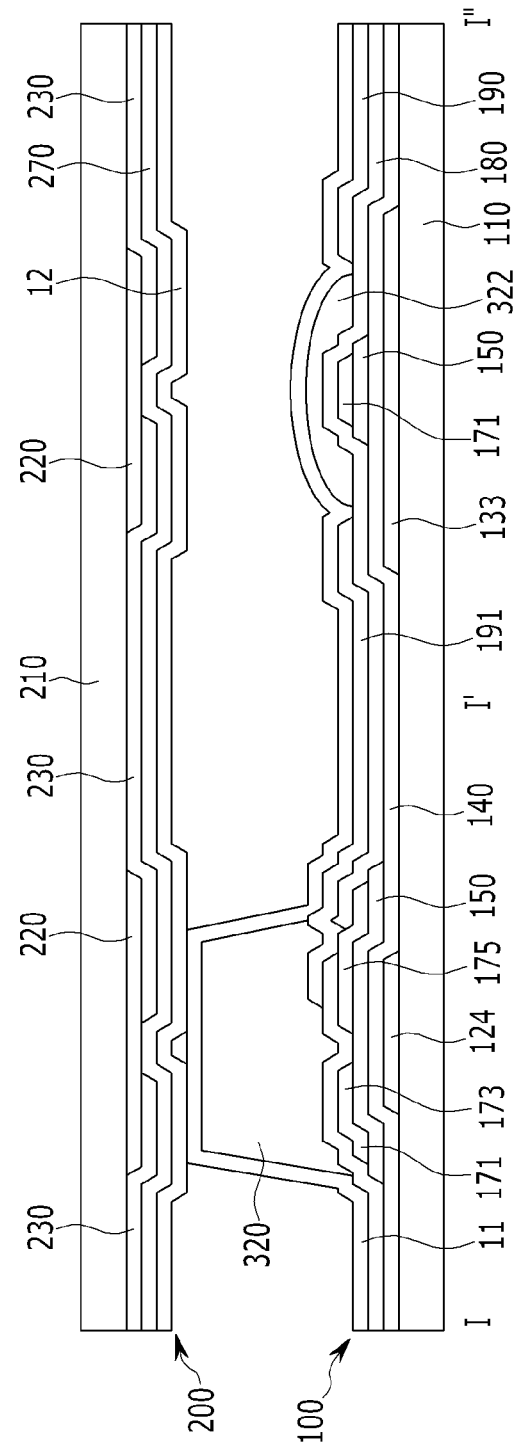
FIG. 2 is a cross-sectional view of the liquid crystal display according to the exemplary embodiment of the present invention taken along lines I-I' and I'-I'' of FIG. 1.

FIG. 1 is a layout view of a thin film transistor array panel of a liquid crystal display according to an exemplary embodiment of the present invention, and FIG. 2 is a cross-sectional view taken along lines I-I' and I'-I'' of FIG. 1.

The liquid crystal display according to the exemplary embodiment of the present invention includes a thin film transistor array panel 100 and a common electrode panel 200 that face each other as shown in FIGS. 1 and 2.

In the structure of the thin film transistor array panel 100, gate lines 121 and gate electrodes 124 which protrude therefrom are formed on a first substrate 110. The first substrate 110 can be made of a transparent material such as a glass or plastic.

The gate lines 121 transfer a gate signal, and generally extend in a horizontal direction.

A gate insulating layer 140 is formed on the gate line 121. The gate insulating layer 140 may be made of an inorganic insulating material including silicon oxide (SiOx) and silicon nitride (SiNx).

An island-shaped semiconductor layer 150 is formed on the gate insulating layer 140. The semiconductor layer 150 is positioned on the gate electrode 124.

Data lines 171, and a source electrode 173 and a drain electrode 175 which protrude therefrom, are formed on the semiconductor layer 150 and the gate insulating layer 140.

The data lines 171 transmit data signals and generally extend in a vertical direction to intersect the gate lines 121, so as to define a pixel area.

The source electrode 173 lies on the gate electrode 124 and protrudes from the data line 171. The drain electrode 175 is formed on the gate electrode 124 to be spaced apart from the source electrode 173.

The gate electrode 124, the semiconductor layer 150, the source electrode 173, and the drain electrode 175 constitute a thin film transistor and serves as an element that switches the corresponding pixel.

When the thin film transistor array panel is formed according to a process that uses five masks, the semiconductor layer 150 is generally formed between the gate electrode 124 and the source and drain electrodes 173 and 175. In contrast, when the thin film transistor array panel is formed according to a process that uses four masks, the semiconductor layer 150 may extend up to a lower part of the data line 171. FIG. 2 illustrates the latter thin film transistor array panel, although it should be noted that the present invention is not limited thereto, and that the invention includes thin film transistor array panels formed according to any process, including those that use five masks.

A passivation layer 180 is formed on the data line 171, the source electrode 173, and the drain electrode 175. The passivation layer 180 may be made of an inorganic insulating material that includes silicon oxide (SiOx) and/or silicon nitride (SiNx).

A first contact hole 181 is formed on the passivation layer 180 to expose a part of the drain electrode 175.

A pixel electrode 191, which can be made of a transparent electrode material such as indium tin oxide (ITO) or indium zinc oxide (IZO), is formed on the passivation layer 180. The pixel electrode 191 is formed within the pixel area generally defined by the intersection of the gate lines 121 and the data lines 171, and is electrically connected with the drain electrode 175 through the first contact hole 181.

Further, a spacer 320 and a step preventing member 322 are formed on the passivation layer 180. The spacer 320 and the step preventing member 322 may be made of the same material, e.g. a transparent material.

The spacer 320 may be positioned on the thin film transistor. It can be seen from FIG. 2 that the common electrode panel 200 is generally flatter than the thin film transistor array panel 100. Therefore, the effective area ratio formed when the top of the spacer 320 meets the thin film transistor array panel 100 while the spacer 320 is formed on the common electrode panel 200 is larger than the effective area ratio formed when the top of the spacer 320 meets the common electrode panel 200 while the spacer 320 is formed on the thin film transistor array panel 100. The effective area ratio means the ratio of the contacting area of the panel and the spacer to an area of the panel. That is, when the spacer 320 is formed on the common electrode panel 200, its area of contact with the thin film transistor array panel 100 is lower than if the spacer 320 were formed on the panel 100, as the panel 100 is generally less flat, or "rougher," than the panel 200. The spacer 320 is also formed on the thin film transistor to prevent an electrode of the thin film transistor array panel 100 from contacting an electrode of the common electrode panel 200, and thus generating a short-circuit, during a repair process of the thin film transistor.

The step preventing member 322 may be positioned on the data line 171. The step preventing member 322 prevents a step change in height between the data line 171 and the pixel electrode 191. That is, the step preventing member 322 occupies, or at least partially fills, a volume that lies between the data line 171 and pixel electrode 191, so as to smooth out the profile of the substrate 110 in the area between the data line 171 and electrode 191. In this embodiment, the center of the step preventing member 322 overlaps the data line 171, while the periphery of (i.e., edges of) the step preventing member 322 does not overlap the data line 171. That is, the step preventing member 322 lies over, and extends beyond the edges of, the data line 171. Further, the thickness of the periphery of the step preventing member 322 is larger than that of the center of the step preventing member 322. It can be seen that the presence and shape of the step preventing member 322 prevents a step change in height between the data line 171 and the pixel electrode 191, as the upper surface of the step preventing member 322 gradually increases from its periphery to its center. In this case, the overall thickness of the substrate 100, including the step preventing member 322 and the data line 171 therebelow, is largest at the center of the member 322 and gradually gets smaller toward the periphery thereof.

A first alignment layer 11 is formed on the passivation layer 180, the spacer 320, the step preventing member 322 and the pixel electrode 191. During fabrication, the first alignment layer 11 is rubbed to have a predetermined direction. The step preventing member 322 allows the first alignment layer 11 to be formed somewhat flatter than if the member 322 was not present, and this flatter alignment layer 11 is more easily and more completely rubbed. That is, rubbing operations may miss portions of the alignment layer 11 that are formed in depressions, wells, or holes. The step preventing member 322 acts to remove at least some of these depressions, so that the rubbing operations misses fewer portions of the alignment layer 11.

The step preventing member 322 can in some senses be considered a form of a planarizing layer, acting to make the region or volume between the data line 171 and pixel electrode 191 more planar. This step preventing member 322, however, can be contrasted with a typical planarizing layer, in that member 322 extends over a discrete portion of the substrate (namely, a relatively small region overlying data line 171), rather than typical planarizing layers that extend over all, or a significant portion of, their substrates.

The thin film transistor array panel according to the exemplary embodiment of the present invention may further include a storage electrode line 131 formed on the same layer as the gate line 121, as well as a storage electrode 133 which protrudes therefrom.

The storage electrode line 131 extends substantially parallel to, while also being spaced apart from, the gate line 121. The storage electrode 133 protrudes from the storage electrode line 131 to be formed below the data line 171. In this case, the storage electrode 133 may have a width larger than the data line 171.

A second contact hole 182, which exposes a part of the storage electrode line 131 and a part of the storage electrode 133, is also formed on the passivation layer 182. In this case, the second contact hole 182 is formed on the storage electrode line 131 and the storage electrode 133 that lie adjacent to each other near their corresponding gate line 121.

A connection electrode 193 is further formed on the passivation layer 180 to electrically connect the storage electrode line 131 and adjacent storage electrode 133 through the second contact hole 182. The connection electrode 193 may be made of the same material as the pixel electrode 191.

In the common electrode panel 200, light blocking members 220 are formed on a second substrate 210 made of glass or plastic.

The light blocking members 220, which serve to prevent light from being leaked at interfaces between pixel areas, may be formed to correspond generally to the data line 171, the gate line 121, and the thin film transistor. The light blocking member 220 may be formed wider than the structure that it is formed over. In this case, the light blocking member 220 corresponding to the data line 171 may have a width larger than the data line 171.

A color filter 230 is formed on the second substrate 210 to correspond to the pixel area. The color filer 230 may at least partially overlap the light blocking member 220.

A common electrode 270 may be formed on a front surface of the second substrate 210, so as to cover the light blocking members 220 and the color filter 230.

A second alignment layer 12 is formed on the common electrode 270, and is rubbed to have a predetermined direction.

Although not shown, a liquid crystal layer is injected between the thin film transistor array panel 100 and the common electrode panel 200. The liquid crystal molecules of the liquid crystal layer have a predetermined direction in accordance with rubbing directions of the first and second alignment layers 11 and 12.

Aspects of the structure of displays configured according to embodiments of the invention have been described above. Attention now turns to a method of manufacturing at least one such liquid crystal display.

FIGS. 3A to 3K are process cross-sectional views illustrating a manufacturing method of a liquid crystal display according to an exemplary embodiment of the present invention. FIG. 4 is a diagram illustrating a mask used to manufacture the liquid crystal display according to the exemplary embodiment of the present invention.

This manufacturing method generally includes manufacturing a thin film transistor array panel, manufacturing a common electrode panel, and attaching the thin film transistor array panel and the common electrode panel to each other. Although any one of the thin film transistor array panel and the common electrode panel can be formed first, hereinafter, a manufacturing method for the thin film transistor array panel is described first, and a manufacturing method for the common electrode panel is described next.

Figure 3A:
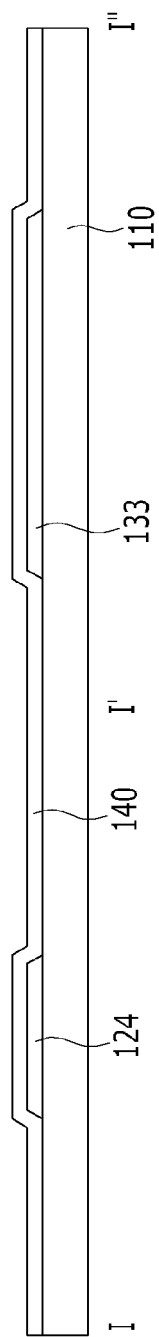
FIGS. 3A to 3K are process cross-sectional views illustrating a method for manufacturing a liquid crystal display according to an exemplary embodiment of the present invention.
Figure 4:
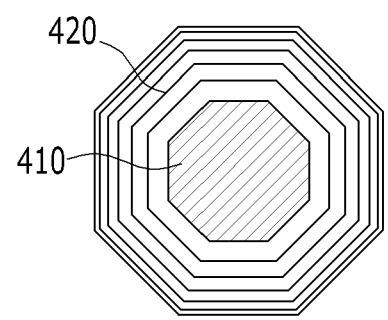
FIG. 4 is a diagram illustrating a mask used to manufacture the liquid crystal display according to the exemplary embodiment of the present invention.

First, as shown in FIG. 3A, a gate line 121 and gate electrode 124 are formed. The gate line 121 is formed to extend generally in one direction, and is made of a conductive material. A gate electrode 124 is formed to protrude therefrom. Both the gate line 121 and gate electrode 124 are formed on a substrate 110 made of transparent glass or plastic.

A storage electrode line 131 and storage electrode 133 are also formed. In this case, the storage electrode line 131 extends substantially parallel to the gate line 121, while being spaced apart from the gate line 121. A storage electrode 133 is also formed, so as to protrude therefrom.

Subsequently, a gate insulating layer 140 is formed on the gate line 121, the gate electrode 124, the storage electrode line 131, and the storage electrode 133. The gate insulating layer 140 may be made of any suitable insulating material, such as an inorganic insulating material including silicon oxide (SiOx) and silicon nitride (SiNx).

Figure 3B:
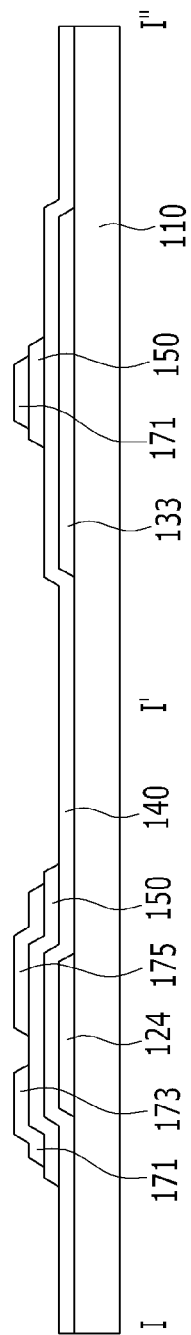

As shown in FIG. 3B, a semiconductor layer 150 is formed on the gate insulating layer 140. Then, a data line 171, a source electrode 173, and a drain electrode 175 which protrude therefrom are formed on the semiconductor layer 150 and the gate insulating layer 140.

The semiconductor layer 150 is positioned on the gate electrode 124. In this case, the semiconductor layer 150 may extend up to a lower part of the data line 171.

The data line 171 intersects the gate line 121 to generally define a pixel area. The data line 171 may be positioned on the storage electrode 133 and, in this case, the storage electrode 133 may have a width larger than the data line 171.

The source electrode 173 protrudes onto (i.e., over) the gate electrode 124 from the data line 171, and the drain electrode 175 is formed on the gate electrode 124 to be spaced apart from the source electrode 173.

The gate electrode 124, the semiconductor layer 150, the source electrode 173, and the drain electrode 175 collectively constitute a thin film transistor.

In the exemplary embodiment of the present invention, a process of patterning the semiconductor layer 150, the data line 171, the source electrode 173, and the drain electrode 175 by using one mask will be described. However, the present invention is not limited thereto and the semiconductor layer 150, the data line 171, the source electrode 173, and the drain electrode 175 may be patterned by using multiple different masks. In this case, the semiconductor layer 150 is positioned on the gate electrode 124, and does not extend up to the lower part of the data line 171.

Figure 3C:
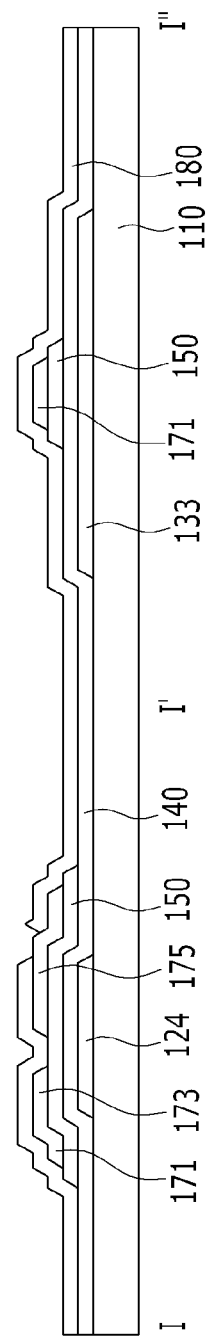

As shown in FIG. 3C, a passivation layer 180 is formed on the data line 171, the source electrode 173, and the drain electrode 175. The passivation layer 180 may be made of any inorganic insulating material such as one including silicon oxide (SiOx) and/or silicon nitride (SiNx).

Subsequently, a first contact hole 181, which exposes a part of the drain electrode 175, is formed on the passivation layer 180.

Although not shown in the process cross-sectional view, referring to FIG. 1, a second contact hole 182 is formed on the passivation layer 180. In this case, the second contact hole 182 of FIG. 1 is formed on storage electrode line 131 of FIG. 1 and its adjacent storage electrode 133 near the gate line 121.

Figure 3D:
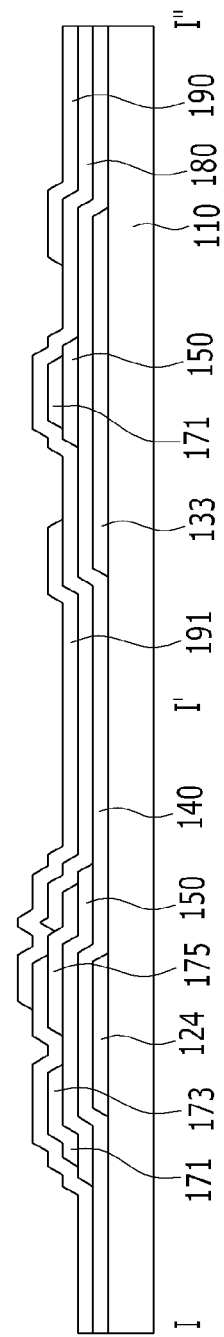

As shown in FIG. 3D, a pixel electrode 191, which is made of a transparent electrode material such as indium tin oxide (ITO) or indium zinc oxide (IZO), is formed on the passivation layer 180. The pixel electrode 191 is formed within the pixel area generally defined by the intersection of the gate line 121 and the data line 171, and is electrically connected with the drain electrode 175 through the first contact hole 181.

Although not shown in the process cross-sectional view, referring to FIG. 1, a connection electrode 183 is formed on the passivation layer 180, so as to electrically connect the storage electrode line 131 and its adjacent storage electrode 133 to each other.

Figure 3E:
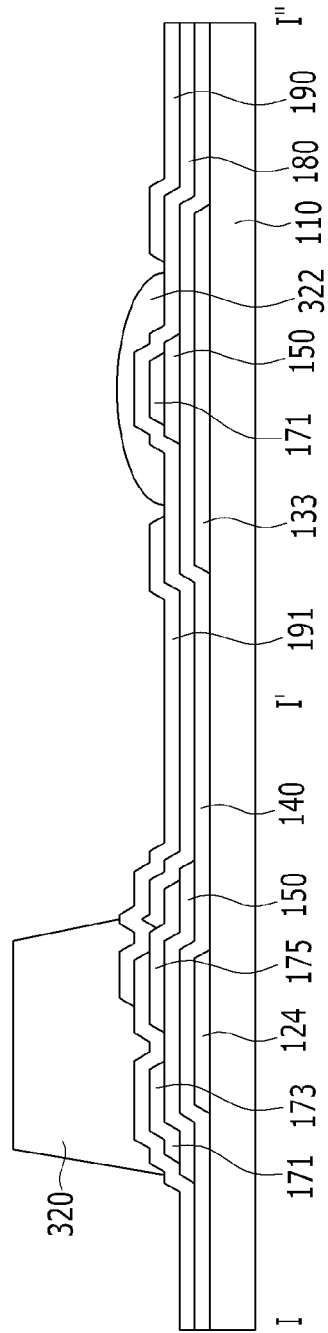

As shown in FIG. 3E, a spacer 320 and a step preventing member 322 are formed on the passivation layer 180. The spacer 320 and the step preventing member 322 can be made of the same material, and may both be made of a transparent material.

The spacer 320 may be positioned on the thin film transistor.

The step preventing member 322 may be positioned on the data line 171. As described above, the step preventing member 322 prevents or reduces a step between the data line 171 and the pixel electrode 191. The center of the step preventing member 322 overlaps the data line 171, but the periphery (i.e., edges) of the step preventing member 322 does not overlap the data line 171. Further, the thickness of the periphery of the step preventing member 322 is larger than that of the center of the step preventing member 322. The step between the data line 171 and the pixel electrode 191 may be prevented by the shape of the step preventing member 322, which gradually gets thicker toward the periphery from the center. In this case, the thickness including the step preventing member 322 and the data line 171 therebelow is largest at the center of member 322, and gradually gets smaller toward the periphery thereof.

The spacer 320 and the step preventing member 322 are patterned by using one mask. In this case, a slit mask or a half-tone mask may be used. In particular, the step preventing member 322 has a shape in which its thickness gradually gets larger as one travels toward the periphery from the center.

FIG. 4 is a diagram illustrating a mask used to manufacture the liquid crystal display according to the exemplary embodiment of the present invention, and in particular, a diagram illustrating a part of the mask corresponding to a location where the step preventing member 322 is to be formed.

In the case of the mask for the step preventing member 322, a part forming the center of the step preventing member 322 may be formed by a half-tone mask 410 and a part forming the periphery may be formed by the slit mask 420. In this case, the slit mask includes slits, and a gap of the slits gradually gets smaller toward the periphery to make the thickness of the step preventing member 322 gradually increase toward the periphery from the center.

Figure 3F:
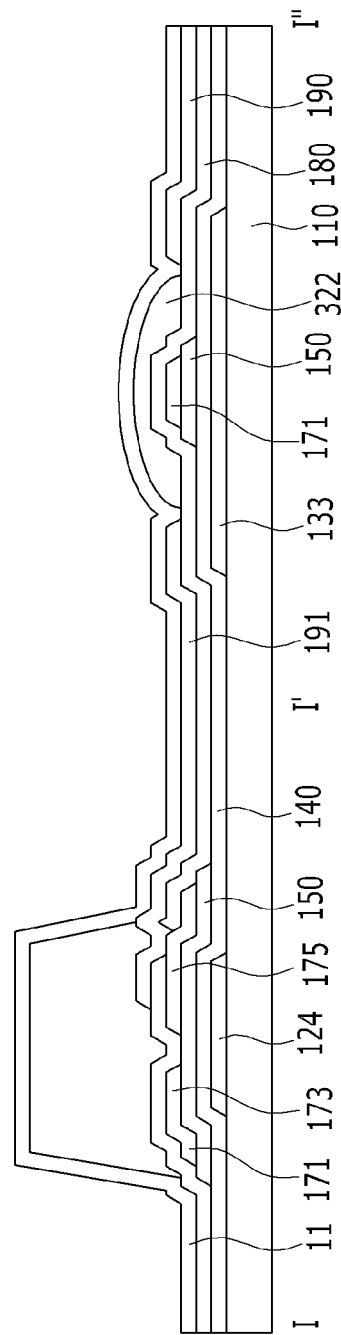

As shown in FIG. 3F, a first alignment layer 11 is formed on the first substrate 110 over the passivation layer 180, the spacer 320, the step preventing layer 322, and the pixel electrode 191.

Subsequently, the first alignment layer 11 is rubbed to have a predetermined direction by using a roller. In this case, the step between the data line 171 and the pixel electrode 191 is decreased by the step preventing member 322, as a result, the first alignment layer 11 may be flatly, i.e. more completely, rubbed.

Figure 3G:
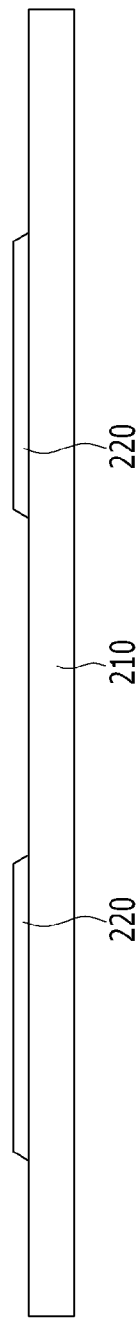

As shown in FIG. 3G, a light blocking member 220 is formed on a second substrate 210 made of glass or plastic.

The light blocking members 220 serve to prevent light from being leaked at interfaces between pixel areas, and may be formed to correspond to the data line 171, the gate line 121, and the thin film transistor. In this case, the light blocking member 220 corresponding to the data line 171 may have a width larger than the data line 171.

Figure 3H:
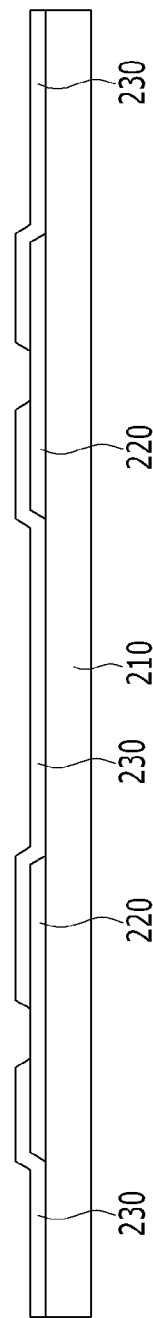

As shown in FIG. 3H, a color filter 230 is formed on the second substrate 210 to correspond to the pixel area. The color filer 230 may at least partially overlap the light blocking member 220.

Figure 3I:
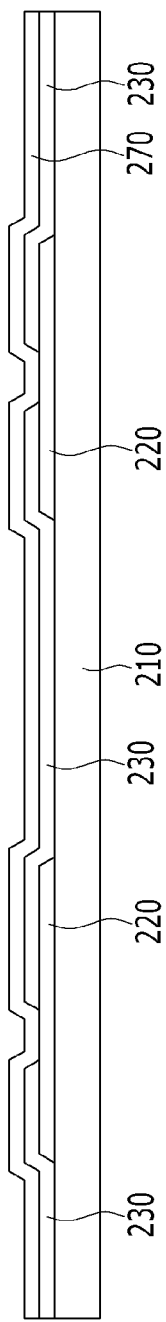

As shown in FIG. 3I, a common electrode 270 may be formed on a front surface of the second substrate 210 over the light blocking members 220 and the color filter 230.

Figure 3J:
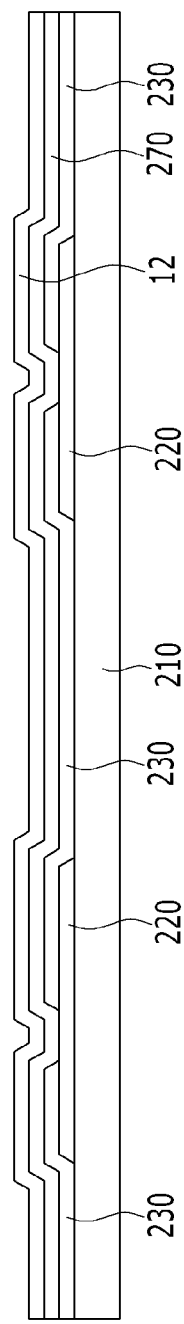

As shown in FIG. 3J, a second alignment layer 12 is formed on the common electrode 270.

Subsequently, the second alignment layer 12 is rubbed to have a predetermined direction by using the roller.

Figure 3K:
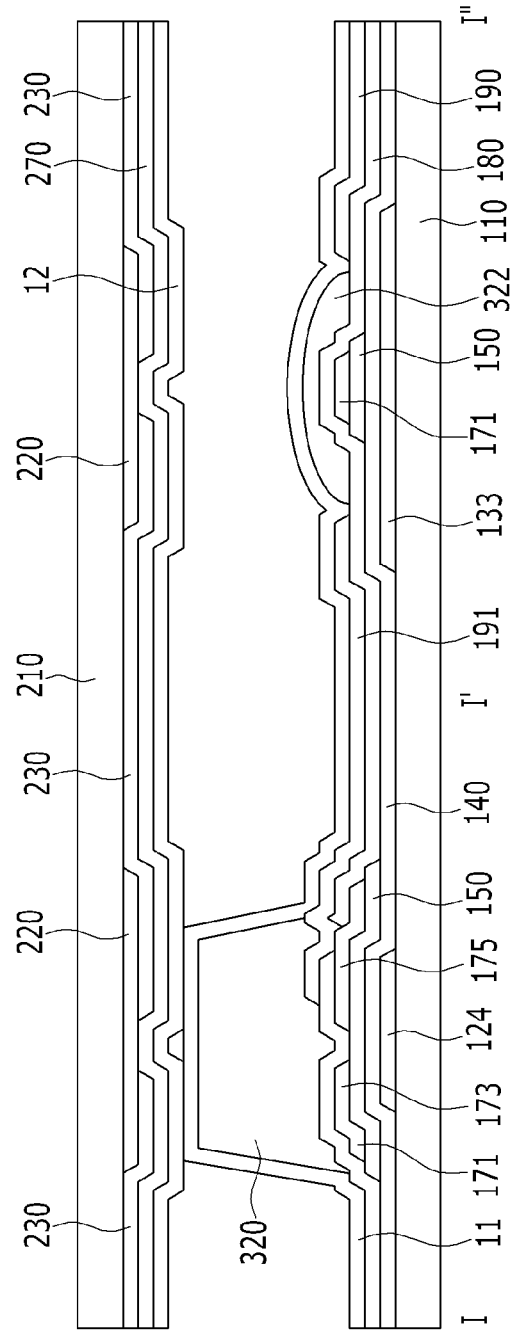

As shown in FIG. 3K, the first substrate 110 and the second substrate 210 are positioned to be opposed to and to face each other and thereafter, are attached to each other.

Subsequently, although not shown in the figure, a liquid crystal layer is formed by injecting liquid crystals between the first substrate 110 and the second substrate 210.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

<Description of Symbols>

| 11: First alignment layer | 12: Second alignment layer |
|---|---|
| 100: Thin film transistor array panel | 110: First substrate |
| 121: Gate line | 124: Gate electrode |
| 131: Storage electrode line | 133: Storage electrode |
| 150: Semiconductor layer | 171: Data line |
| 173: Source electrode | 175: Drain electrode |
| 181: First contact hole | 182: Second contact hole |
| 191: Pixel electrode | 193: Connection electrode |
| 200: Common electrode panel | 210: Second substrate |
| 220: Light blocking member | 230: Color filter |
| 270: Common electrode | 320: Spacer |
| 322: Step preventing member | |

What is claimed is:

1. A thin film transistor array panel, comprising:
a first substrate;
a gate line and a data line formed on the first substrate;
a step preventing member overlapping the data line without overlapping a pixel electrode in a direction perpendicular to a bottom surface of the first substrate, a portion of the step preventing member being positioned between the data line and the pixel electrode; and
a spacer formed on the first substrate,
wherein a thickness of a periphery of the step preventing member is larger than a thickness of a center of the step preventing member, and
wherein a thickness of the step preventing member increases from the center of the step preventing member to the periphery of the step preventing member.

2. The thin film transistor array panel of claim 1, further comprising:
a thin film transistor connected to the gate line and the data line,
wherein the spacer is formed on the thin film transistor, and wherein the spacer and the step preventing member comprise the same material.

3. The thin film transistor array panel of claim 2, wherein:
the width of the step preventing member is wider than the width of the data line; and
the center of the step preventing member at least partially overlaps the data line, and the periphery of the step preventing member does not overlap the data line.

4. The thin film transistor array panel of claim 2, wherein:
the center of the step preventing member is formed according to a half-tone mask.

5. The thin film transistor array panel of claim 4, wherein:
the periphery of the step preventing member is formed according to a slit mask.

6. The thin film transistor array panel of claim 5, wherein:
the slit mask includes slits, and gaps between the slits are narrower proximate to an edge of the slit mask than proximate to a center of the slit mask.

7. The thin film transistor array panel of claim 1, further comprising:
an alignment layer formed on the first substrate and rubbed by a roller.

8. The thin film transistor array panel of claim 1, wherein:
the spacer and the step preventing member each comprise a transparent material.

9. The thin film transistor array panel of claim 1, further comprising:
a storage electrode at least partially overlapping the data line on the first substrate, the storage electrode having a width larger than a width of the data line.

10. A thin film transistor array panel, comprising:
a first substrate;
a gate line and a data line formed on the first substrate;
a storage electrode at least partially overlapping the data line on the first substrate and having a width larger than a width of the data line;
a thin film transistor connected to the gate line and the data line;
a pixel electrode formed in a pixel area defined generally by the gate line and the data line;
a step preventing member overlapping the data line, a portion of the step preventing member being positioned between the data line and the pixel electrode; and
a spacer formed on the thin film transistor,
wherein the spacer and the step preventing member comprise the same material,
wherein a maximum thickness of the spacer is greater than a maximum thickness of the step preventing member,
wherein the data line is disposed between the step preventing member and the storage electrode, and
wherein a thickness of the step preventing member increases from a center of the step preventing member to a periphery of the step preventing member.

11. The thin film transistor array panel of claim 10, wherein the thin film transistor includes:
a gate electrode protruding from the gate line;
a source electrode protruding onto the gate electrode from the data line;
a drain electrode spaced apart from the source electrode; and
a semiconductor layer formed between the gate electrode and the source and drain electrodes.

12. The thin film transistor array panel of claim 11, wherein:
the semiconductor layer extends to the data line.

13. The thin film transistor array panel of claim 11, further comprising:
a gate insulating layer formed on the gate line and the gate electrode; and
a passivation layer formed on the data line, the source electrode, and the drain electrode,
wherein the gate insulating layer and the passivation layer each comprise an inorganic insulating material including silicon oxide and silicon nitride.

14. The thin film transistor array panel of claim 13, wherein:
the center of the step preventing member is formed according to a half-tone mask,
the periphery of the step preventing member is formed according to a slit mask including slits, wherein gaps between the slits are narrower proximate to an edge of the mask than proximate to a center of the mask.

15. The thin film transistor array panel of claim 13, further comprising:
an alignment layer formed on the passivation layer and the pixel electrode,
wherein the alignment layer is rubbed by a roller.

16. The thin film transistor array panel of claim 10, further comprising:
a storage electrode line formed generally parallel to the gate line,
wherein the storage electrode line is connected to the storage electrode.

17. A liquid crystal display, comprising:
a first substrate and a second substrate overlapping each other;
a gate line and a data line formed on the first substrate;
a thin film transistor connected to the gate line and the data line;
a pixel electrode formed in a pixel area defined generally by the gate line and the data line;
a step preventing member formed between the liquid crystal layer and the data line without overlapping the pixel electrode in a direction perpendicular to a bottom surface of the first substrate, a portion of the step preventing member being positioned between the data line and the pixel electrode;
a spacer formed on the thin film transistor; and
a light blocking member formed on the second substrate to correspond to the data line and having a width larger than a width of the data line,
wherein a thickness of the step preventing member increases from a center of the step preventing member to a periphery of the step preventing member.

18. The liquid crystal display of claim 17, further comprising:
a common electrode formed on a front surface of the second substrate,
wherein the spacer and the step preventing member comprise the same material.

19. The liquid crystal display of claim 18, further comprising:
a color filter formed on the second substrate and positioned to correspond to the pixel area.

20. The liquid crystal display of claim 19, further comprising:
a storage electrode at least partially overlapping the data line on the first substrate and having a width larger than a width of the data line.

21. The liquid crystal display of claim 20, wherein the thin film transistor includes:
a gate electrode protruding from the gate line;
a source electrode protruding onto the gate electrode from the data line;
a drain electrode spaced apart from the source electrode; and
a semiconductor layer formed below the data line, the source electrode, and the drain electrode.

22. The liquid crystal display of claim 21, further comprising:
a gate insulating layer formed on the gate line and the gate electrode; and
a passivation layer formed on the data line, the source electrode, and the drain electrode,
wherein the gate insulating layer and the passivation layer each comprise an inorganic insulating material including silicon oxide and silicon nitride.

23. The liquid crystal display of claim 22, wherein:
the center of the step preventing member is formed according to a half-tone mask, and
the periphery of the step preventing member is formed according to a slit mask including slits, and gaps between the slits are narrower proximate to an edge of the mask than proximate to a center of the mask.

24. The liquid crystal display of claim 22, further comprising:
an alignment layer formed on the passivation layer and the pixel electrode,
wherein the alignment layer is rubbed by a roller.

25. A method of fabricating a thin film transistor array panel, the method comprising:
(a) forming a gate line and a gate electrode on a first substrate;
(b) forming a gate insulating layer on the gate line and the gate electrode;
(c) forming a semiconductor layer on the gate insulating layer to correspond to the gate electrode;
(d) forming a data line, a source electrode, and a drain electrode on the gate insulating layer and the semiconductor layer;
(e) forming a passivation layer on the data line, the source electrode, and the drain electrode;
(f) forming a contact hole on the passivation layer to expose at least a portion of the drain electrode;
(g) forming a pixel electrode that is connected to the drain electrode through the contact hole in a pixel area generally defined by the gate line and the data line; and
(h) forming a spacer corresponding to a thin film transistor that includes the gate electrode, the source electrode, and the drain electrode, and forming a step preventing member on the passivation layer such that the step preventing member overlaps the data line without overlapping the pixel electrode in a direction perpendicular to a bottom surface of the first substrate, such that a portion of the step preventing member is positioned between the data line and the pixel electrode, and such that a thickness of the step preventing member increases from a center of the step preventing member to a periphery of the step preventing member.

26. The method of claim 25, wherein:
the spacer and the step preventing member comprise the same material.

27. The method of claim 26, wherein:
the spacer and the step preventing member each comprise a transparent material.

28. The method of claim 25, wherein:
the center of the step preventing member at least partially overlaps the data line and the periphery of the step preventing member does not overlap the data line.

29. The method of claim 25, wherein:
the center of the step preventing member is formed according to a half-tone mask,
the periphery of the step preventing member is formed according to a slit mask including slits, wherein gaps between the slits are narrower proximate to an edge of the mask than proximate to a center of the mask, and
the half-tone mask and the slit mask are included in one mask.

30. The method of claim 25, further comprising:
(i) forming an alignment layer on the first substrate and over the spacer and the step preventing member; and
(j) rubbing the alignment layer with a roller.

31. The method of claim 25, wherein:
the semiconductor layer, the data line, the source electrode, and the drain electrode are formed according to one mask, and
the semiconductor layer extends to the data line.

32. The method of claim 25, wherein (a) further comprises forming a storage electrode line extending generally parallel to the gate line, and a storage electrode connected to the storage electrode line,
wherein the storage electrode at least partially overlaps the data line and has a width larger than a width of the data line.

33. The method of claim 25, wherein
the gate insulating layer and the passivation layer each comprise an inorganic insulating material including silicon oxide and silicon nitride.

* * * * *